United States Patent
Buquet

(10) Patent No.: US 9,528,912 B2
(45) Date of Patent: Dec. 27, 2016

(54) SYSTEM AND METHOD FOR CLOSED LOOP TESTING A ROTARY MACHINE IN AN ELECTRIC NETWORK

(71) Applicant: General Electric Company, Schenectady, NY (US)

(72) Inventor: Maxime Buquet, Belfort (FR)

(*) Notice: Subject to any disclaimer, the term of this patent is extended or adjusted under 35 U.S.C. 154(b) by 225 days.

(21) Appl. No.: 14/307,936

(22) Filed: Jun. 18, 2014

(65) Prior Publication Data

US 2015/0177104 A1 Jun. 25, 2015

(30) Foreign Application Priority Data

Dec. 23, 2013 (FR) ..................... 13 63398

(51) Int. Cl.
*G01M 15/14* (2006.01)
*F02C 7/00* (2006.01)
*G01R 21/00* (2006.01)

(52) U.S. Cl.
CPC .............. *G01M 15/14* (2013.01); *F02C 7/00* (2013.01); *G01R 21/00* (2013.01); *F05D 2220/76* (2013.01); *F05D 2260/80* (2013.01); *F05D 2270/061* (2013.01)

(58) Field of Classification Search
CPC ........................ G01M 15/14; F02D 2270/06
USPC .......................................... 73/112.01, 112.03
See application file for complete search history.

(56) References Cited

U.S. PATENT DOCUMENTS

| | | | |
|---|---|---|---|
| 3,598,208 A | 8/1971 | Bronder | |
| 6,164,057 A * | 12/2000 | Rowen | F02C 9/54 60/39.27 |
| 8,076,789 B2 * | 12/2011 | Miller | F03D 7/048 290/43 |
| 8,191,410 B2 | 6/2012 | Hansen et al. | |
| 8,452,515 B2 | 5/2013 | Drohan et al. | |
| 8,604,822 B2 | 12/2013 | Schroeder et al. | |
| 2002/0190695 A1 | 12/2002 | Wall et al. | |
| 2003/0011199 A1 | 1/2003 | Wickert et al. | |
| 2006/0132993 A1 * | 6/2006 | Delmerico | F03D 7/0284 361/20 |
| 2007/0271929 A1 | 11/2007 | Berry | |
| 2009/0160187 A1 * | 6/2009 | Scholte-Wassink | F03D 7/0284 290/44 |
| 2009/0223307 A1 * | 9/2009 | Staedler | F03D 7/0248 73/862.09 |
| 2011/0048119 A1 | 3/2011 | Hansen et al. | |
| 2013/0282195 A1 * | 10/2013 | O'Connor | F01K 13/02 700/291 |
| 2014/0260293 A1 * | 9/2014 | Chen | F02C 9/00 60/773 |

(Continued)

FOREIGN PATENT DOCUMENTS

EP 2378085 A2 10/2011

*Primary Examiner* — Eric S McCall
(74) *Attorney, Agent, or Firm* — Armstrong Teasdale LLP

(57) ABSTRACT

A system for testing a rotary machine includes a variable load coupled to a shaft driven by the rotary machine, and a controller configured to regulate the rotary machine and the variable load in a closed loop. A variation in a load value of the variable load causes a variation in a power produced by the rotary machine. The controller is further configured to determine a response time required for the power produced by the rotary machine and a power consumed by the variable load to be balanced.

20 Claims, 2 Drawing Sheets

(56) References Cited

U.S. PATENT DOCUMENTS

2015/0121872 A1* 5/2015 Yashiki .................. F22B 35/00
  60/646
2015/0177106 A1* 6/2015 Fuller .................. G01M 15/14
  73/112.01

* cited by examiner

SYSTEM AND METHOD FOR CLOSED LOOP TESTING A ROTARY MACHINE IN AN ELECTRIC NETWORK

CROSS-REFERENCE TO RELATED APPLICATION

This application claims priority to French patent application Serial No. 13 63398, entitled "SYSTÈME ET PROCÉDÉ DE TEST D'UNE MACHINE TOURNANTE" (System and Process of Test of a Rotary Machine), filed Dec. 23, 2013, the disclosure of which is incorporated herein by reference in its entirety.

BACKGROUND

The field of the disclosure relates generally to a rotary machine, and more particularly to testing of a rotary machine, for example, a gas turbine, which, within the framework of an electrical energy production facility, rotates a generator connected to an electrical energy distribution network.

At least some known regulations impose constraints for the connection and synchronization of rotary machines with an interconnected electricity distribution network. These regulations are sometimes referred to as the "grid code." Such regulations exist for each country or for geographic zones.

These regulations allow the development, maintenance, and usage of a coordinated, efficient, and economic electricity transmission system. Moreover, they ensure performance and reliability of the distribution network and elements which are connected to it for the country or geographic zone for which they are applicable.

These regulations or "specifications of the electricity distribution network manager" are based on technical aspects concerning connections of various elements to the network, but also on operation and use of a transport network, and particularly electrical lines and electrical facilities connected to the distribution network.

These regulations may specify that users are liable to provide the data required for planning and usage of the network, such as electricity demand forecasts, availability of electrical energy generation equipment, and the dates fixed for maintenance of large electricity generator assemblies.

In addition to the technical design aspects of a network, the "grid code" may define very specific operational criteria.

For example, it may relate to defining the rated frequency of the network, as well as the frequency variations accepted with regard to this rated frequency.

For example, in France, the electricity distribution network frequency is nominally 50 Hz and must be controlled within the limits of 49.5 to 50.5 Hz. For other countries, the rated frequency is of 60 Hz and must be between 59.5 and 60.5 Hz.

Furthermore, to participate in the primary setting of the network frequency, each network facility must provide to the network an active power reserve generally referred to as the "primary reserve." For example, this reserve is equal to a percentage of the maximum power. Thus, each electrical energy generation unit participating in the setting of the network frequency has a proper margin of available power. By interconnection of the electrical networks, the total primary network corresponds to the amount of primary reserves of all the units participating in the primary setting of the frequency.

This primary reserve allows regaining balance between production and consumption and constitutes, from the various components enabling the primary setting of the frequency, the component with the shortest response time. In fact, in Continental Europe, part of the primary reserve must be mobilized in less than 15 seconds and the whole reserve in less than 30 seconds.

Furthermore, the electricity generation units are fitted with speed regulator devices which enable adapting their power according to the rotation speed of the rotary machine and, consequently, the network frequency. The mobilized part of the primary reserve is in proportion to the difference between the actual instant speed, represented by the measured frequency f, and the rated speed, corresponding to the set point frequency f0, according to the relation:

$$\delta = \lambda (f - f0)$$

where $\lambda$ refers to the power setting of the unit.

On a 50 Hz network, it is not only necessary to know the response in power of the electricity generation units as a function of time, at a constant rotation speed of a rotary machine equipping the electricity generation unit, but also the capacity for limitation of the frequency drift over time at transient speeds.

In particular, an increase in the proportion of power supplied from renewable energy and fluctuations in the electricity demand in small electrical networks creates a need for increasing the dynamic response of combined cycles, at full load or at partial load, as well as for revising the response time of the electric network generation units.

Thus, tests are implemented on electric networks to demonstrate the actual capacity of the electricity generation units to respond to transient phenomena. However, it is necessary that these tests are carried out under very precise conditions. In practice, tests on an actual network are difficult to execute due to the operating conditions of the network. In fact, this type of test does not allow implemented tests under load outside the rated frequency of the network, if it is not deliberately degraded. It is also not possible to implement tests on a large scale without affecting the network users. Moreover, risks associated with any test failures and, thus, eventual disturbances or breaks in supply for all users, must be considered in relation to the benefits provided by execution of the test.

Furthermore, this type of test requires considerable resources in terms of electrical energy, fuel, and auxiliary fluids (for example, but not by way of limitation, oil and coolant). Also, the time required to prepare and execute tests under actual conditions may be considerable. Noise nuisance also should be considered when the test facilities are located near cities or other populated areas.

This is why some known gas turbine manufacturers use test benches to test the behavior of the turbines.

In this regard, U.S. Pat. No. 3,598,208 describes the use of a hydraulic brake to test the behavior of a gas turbine. In fact, in contrast to the connection of a turbine to an electrical network through a generator, the connection of a turbine to a hydraulic brake allows the turbine to operate at the rated frequency of the network, or at a lower or higher frequency.

Furthermore, the power of the shaft of a gas turbine coupled with a generator may be measured by a dynamometer or by a hydraulic brake, either by direct measure of the torque between the power turbine and the driven equipment or the power at the generator outlet, or by indirect measurement, calculation of the power of the gas turbine compressor.

Also, U.S. Patent Publication No. 2003/0011199 describes the regulation of valves to control air flow entering a compressor of a gas turbine in order to control its speed, by acting, for example, on the adjustable valves when the frequency is less than the rated frequency of the network to obtain a gradual change of frequency till the rated frequency is attained.

Furthermore, U.S. Patent Publication No. 2007/0271929 describes a method of synchronizing the speed of a gas turbine with the frequency of a distribution network by controlling the action of the compressor in order to control the power generated by the turbine.

In European Patent No. 2,378,085, a control device is used to change the torque of the turbine to respond to a frequency fluctuation on the electricity distribution network.

Furthermore, U.S. Pat. No. 8,191,410 describes a test bench in which a compressor is driven by a gas turbine in order to create a map of compression ratio and corrected air flows, which allows determination of corrected speed lines and the boundary conditions of compressor surge at full load and at partial load.

Finally, U.S. Pat. No. 8,452,515 describes simulation of the behavior of a gas turbine compressor.

BRIEF DESCRIPTION

In one aspect, a system for testing a rotary machine is provided. The system includes a variable load coupled to a shaft driven by the rotary machine, and a controller configured to regulate the rotary machine and the variable load in a closed loop. A variation in a load value of the variable load causes a variation in a power produced by the rotary machine. The controller is further configured to determine a response time required for the power produced by the rotary machine and a power consumed by the variable load to be balanced.

In another aspect, a method for testing a rotary machine is provided. The method includes coupling a variable load to a shaft driven by the rotary machine, and regulating the rotary machine and the variable load in a closed loop. A variation in a load value of the variable load causes a variation in a power produced by the rotary machine. The method also includes determining a response time required for the power produced by the rotary machine and a power consumed by the variable load to be balanced.

DETAILED DESCRIPTION

Figure 1:
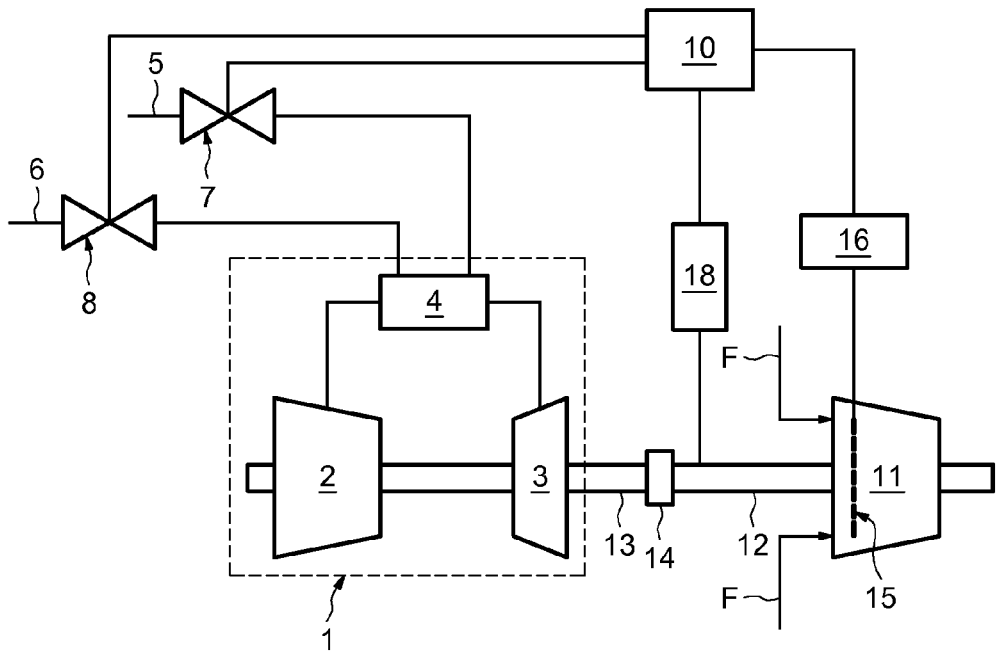
FIG. 1 is a schematic view of a first exemplary embodiment of a gas turbine test system.

The exemplary embodiments of a system and a method described herein facilitate testing of a rotary machine, particularly a gas turbine, without implementing a test of the rotary machine on the electrical network.

Thus, the embodiments described herein simplify and reduce the risks related to the implementation of a test of such a rotary machine, as well as the resources and duration required to execute such a test.

The embodiments described herein provide a rotary machine test system that includes a variable load rigidly coupled to a shaft driven by the rotary machine, a controller capable of implementing closed loop regulation of the rotary machine and its variable load such that load variation of the latter causes variation in the power produced by the rotary machine, and means to determine the response time required for the power produced by the rotary machine and a power consumed by said variable load to be balanced.

Thus, embodiments described herein enable determining the behavior of a rotary machine in response to a request or an incident within an electrical network to which it is connected.

Furthermore, it will be noted that the use of a variable load enables simulating an event in an isolated network in order to test the capacity of the rotary machine to respond to this event during transient phases.

Furthermore, the embodiments described herein enable a determination of the capacity of the rotary machine to provide power for a predetermined period in actual conditions of operation, outside its rated speed range.

According to another aspect, the variable load is coupled to the controller which determines the modification of the load value of the variable load.

In execution mode, the embodiments described herein provide devices for measuring the rotation speed of the shaft, coupled to the controller, and the balancing of the powers produced and consumed is determined from the measured rotation speed of the shaft.

Advantageously, the variable load includes a compressor with input means for adjusting the flow of air admitted into the inlet of the compressor.

When the variable load is a compressor, the controller may have a compressor load map based on the air flow admitted through the inlet in the compressor. This will provide details on the load value of the variable load for a given change in the air flow entering in the compressor.

This map may be obtained beforehand through simulation or empirical tests. This provides a reference point for the power balance to be attained without requiring additional measuring means.

Alternatively, the variable load may include an alternator coupled to a resistive load through a circuit breaker.

The variable load may also include an alternator coupled through a circuit breaker to a motor driving a mechanical load.

According to an embodiment, the rotary machine comprises a gas turbine, and the system includes devices to adjust the flow of fuel powering the gas turbine, controlled by the controller.

The test system also may include devices for controlling the fluid flow to the gas turbine, driven by the controller.

According to a second aspect, a test method for a rotary machine is provided, including connecting a variable load to a shaft driven by the machine, regulating the rotary machine and its variable load in a closed loop such that the load variation of the latter causes variation in power produced by the rotary machine, and determining the response time required such that the power produced by the rotary machine and the power consumed by the load are equal.

The reference capacity of the variable load that should be attained for the balance between power produced and power consumed may be determined from a predetermined map of compressor load according to the air flow admitted through the compressor inlet.

In an aspect, the variable load is a rotary load at variable rotation speed, and the balance of power produced and power consumed is determined from the measurement of the rotation speed of the shaft.

For example, a set of load variation values associated with the measured response time of the rotary machine are stored in a map.

Advantageously, the rotary load is a compressor associated with means for setting the air flow admitted through the inlet in the compressor, including at least one regulation valve. The map stores valve settings and corresponding rotation speed values.

For each variation in valve setting, an amplitude and frequency of the variable load may be determined.

FIG. 1 is a schematic view of a first exemplary embodiment of a gas turbine test system. In the exemplary embodiment, the test system is configured to determine a response of a rotary machine 1, in this example a gas turbine 1, following simulation of an event on a network leading to a variation in frequency. Gas turbine 1 includes a compressor 2, an expansion turbine 3, and a combustion system 4.

The combustion system 4 is associated with a fuel supply line 5 and a water supply line 6, each one fitted with a respective regulation valve 7 and 8.

Water injection is generally used to increase the turbine capacity or to control the NOx or CO emission level.

In the illustrated embodiment, regulation valves 7 and 8 are controlled by a controller 10 in a manner that regulates a power of gas turbine 1 by acting on fuel flow regulation valve 7 and on water flow regulation valve 8.

Furthermore, the system includes a variable load 11 fitted on a driven shaft 12 coupled to a shaft 13 of the gas turbine through a coupling 14.

In the illustrated embodiment, variable load 11 is a compressor that includes at least one adjustment valve 15 configured to regulate the air flow (arrows F) admitted through an inlet of the variable load compressor.

Thus, by modulating, for example, an angle of the adjustment valves 15 in the inlet of the variable load compressor, the power consumed by the variable load compressor may be changed.

When the load value is thus modified, the speed varies and the rotary machine 1 must respond to this modification of load value as if it were an event occurring on an electricity distribution network.

In the illustrated embodiment, the setting of the at least one adjustment valve 15 is controlled by controller 10 through an actuator 16.

The controller 10 incorporates all suitable hardware and is programmed to regulate the rotary machine 1 by implementing suitable static regulation, according to which the power produced is automatically adjusted to the power consumed, while leaving a static difference in frequency following variations in the load produced or consumed.

Additionally, the controller is configured to implement isochronous power regulation by proportionately changing the load capacity 11 as a function of the difference between the actual frequency and a set point frequency, corresponding to a set point shaft speed, in order to curb variation of frequency or shaft speed.

Figure 2:
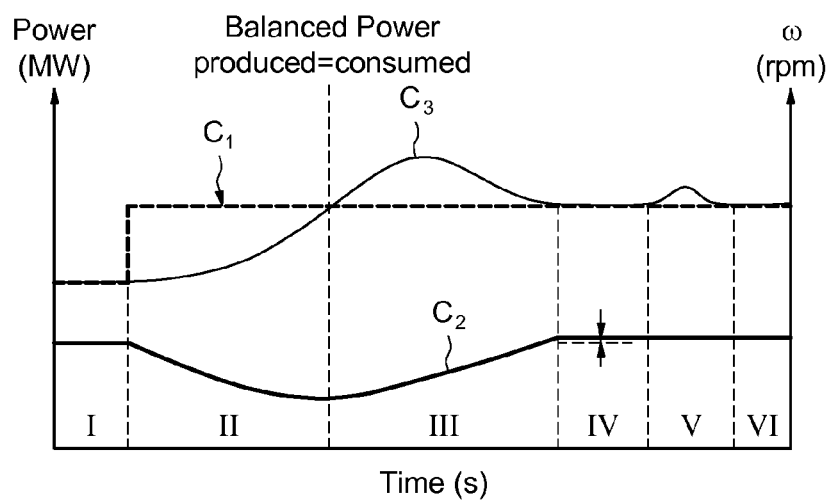
FIG. 2 is a graphical illustration of exemplary operating parameters of the gas turbine test system of FIG. 1.

FIG. 2 is a graphical illustration of an exemplary operation of the gas turbine test system described above. The dotted line C1 represents the load value or capacity imposed by the variable load 11, curve C3 represents the power generated by the rotary machine 1, and curve C2 represents the speed variation of the system, as measured at the shaft.

In the first phase I, the test system is brought to its initial operation point by gradually increasing the load of the rotary machine 1 and the speed of the variable load 11.

Once the system is stable at the initial point I, the isochronous control of the load is disconnected. In other words, in case of variation in the production or demand, only the static regulator of the rotary machine 1 will adjust the capacity in order to ensure a balance between the power produced and consumed.

In the following phase II, the controller 10 acts on the adjustment valves 15 to produce a predetermined load value, or set point power, variation, obtained by adjusting the air flow admitted through the inlet of the compressor of variable load 11. As illustrated in FIG. 2, in this phase II, the action on the adjustment valves 15 causes a load value variation (curve C1) of the variable load 11 of FIG. 1, which causes modification in the power requirement of the rotary machine 1. In fact, under static regulation, the rotary machine 1 must increase its capacity (C3) and the controller 10 acts on the regulation valves 7 and/or 8 to increase the power provided by the gas turbine 1 (Curve C3).

During this phase, the increase in load value results in a decrease in the rotation speed, simulating a decrease in the frequency of the network (C2).

In fact, the imbalance between the power consumed and power produced leads to a variation in the kinetic power exchanged between the rotary machine 1 and the variable load 11. The rotary machine will react to balance the power produced and the power consumed.

It will be noted that the regulation implemented by the controller 10, i.e. modification of the air flow in the inlet of the variable load 11 and the power delivered by the rotary machine 1, is a closed loop regulation. The mathematical expression which relates the torque and the speed variation in this closed system is as follows:

$$J \frac{\delta \omega}{\delta t} = C_{tg} - C_c$$

where:
J refers to the moment of inertia;
$\delta\omega/\delta t$ refers to the shaft speed variation;
$C_{tg}$ is the torque of the gas turbine; and
$C_c$ is the torque of the variable load.

Consequently, when the torque of the variable load $C_c$ increases until the expression $C_{tg}-C_c$ becomes negative, the speed variation becomes negative, which results in a decrease in the rotational speed of the shafts 12 and 13.

It will be appreciated also that the variation in mechanical power produced reaches the variation in mechanical power consumed at the time when the derivative of the speed of the shaft, or "shaft speed drift," is null, i.e.:

$$\frac{\delta \omega}{\delta t} = 0$$

Consequently, as shown in FIG. 2, a balance is obtained between the power produced and the power consumed at the minimum frequency value, in the case of a positive consumption variation. Likewise, the balance in power is obtained for the maximum frequency value, in the case of a negative consumption variation (not shown).

The test system includes a rotation speed sensor 18 (shown in FIG. 1) operably coupled to shaft 12, 13 and configured to measure a rotation speed of shaft 12, 13. Controller 10 uses rotation speed sensor 18 to obtain a direct measurement of the rotation speed of the machines. Based on the fact that the balance in power produced and consumed is obtained for null variations in the shaft speed, controller 10 thus can determine the point of kinetic stability. Controller 10 is configured to measure the response time of rotary machine 1 up to the point of kinetic stability by direct measurement of the rotation speed of the machines, which allows obtaining precise measurement of the response time.

It will be noted that the test system that has been described controls variation of the load value of variable load 11 by acting on the adjustment valves 15 of the variable load compressor. The system measures and stores the values of response time required to obtain balance between the power produced and consumed for different settings of the adjustment valves 15. These response time values are then stored in a map, enabling determination of the change in power of the load 11 corresponding to a change of angle of the adjustment valves 15 in the inlet of the variable load compressor.

It also will be noted that, in the following phases III, IV, V and VI, the kinetic energy of the variable load compressor is gradually re-established, and the power produced by the rotary machine is gradually regulated around the power consumed.

It should be understood that the disclosure is not limited to the embodiment described above.

Figure 3:
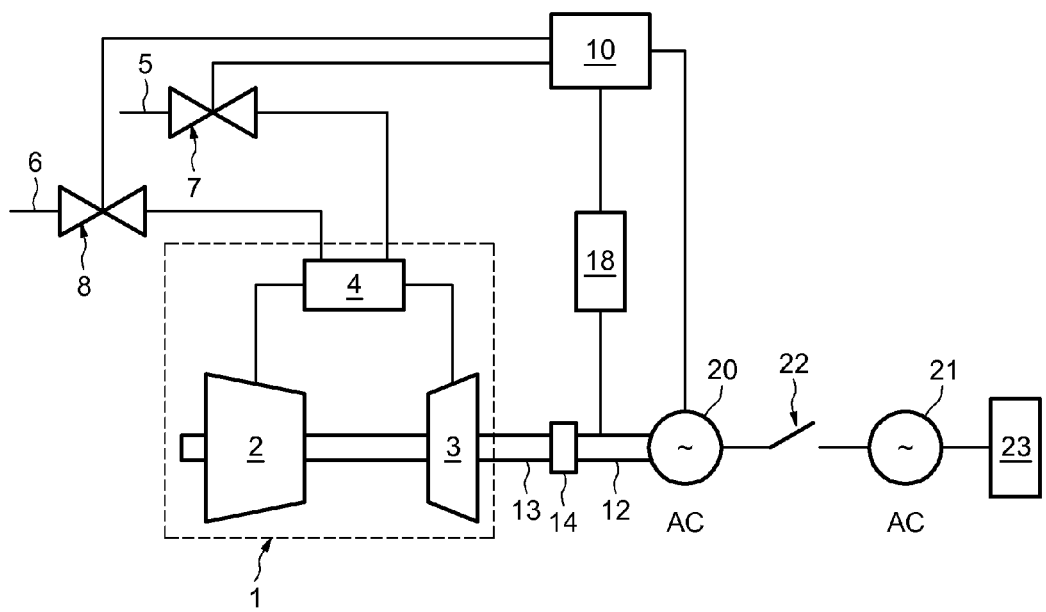
FIG. 3 is a schematic view of a second exemplary embodiment of a gas turbine test system.

In fact, FIG. 3 is a schematic view of a second exemplary embodiment of a gas turbine test system. In FIG. 3, elements identical to those of FIG. 1 bear the same numeric references. The gas turbine, which has, as before, compressor 2 coupled to turbine 3, may be coupled to a variable load 11 that includes an alternator 20 coupled to a motor 21 through a circuit breaker 22. Motor 21 is coupled to a mechanical load 23. In the illustrated embodiment, there is a relation between the mechanical power of the shaft driving the motor and the electric power generated by rotary machine 1.

The illustrated embodiment enables simulating the behavior of an electricity generation system coupled to a generator powered by a renewable source of energy. Thus, the illustrated embodiment enables simulating the effect of a sudden loss of renewable energy, intermittent by nature, such as wind energy.

Figure 4:
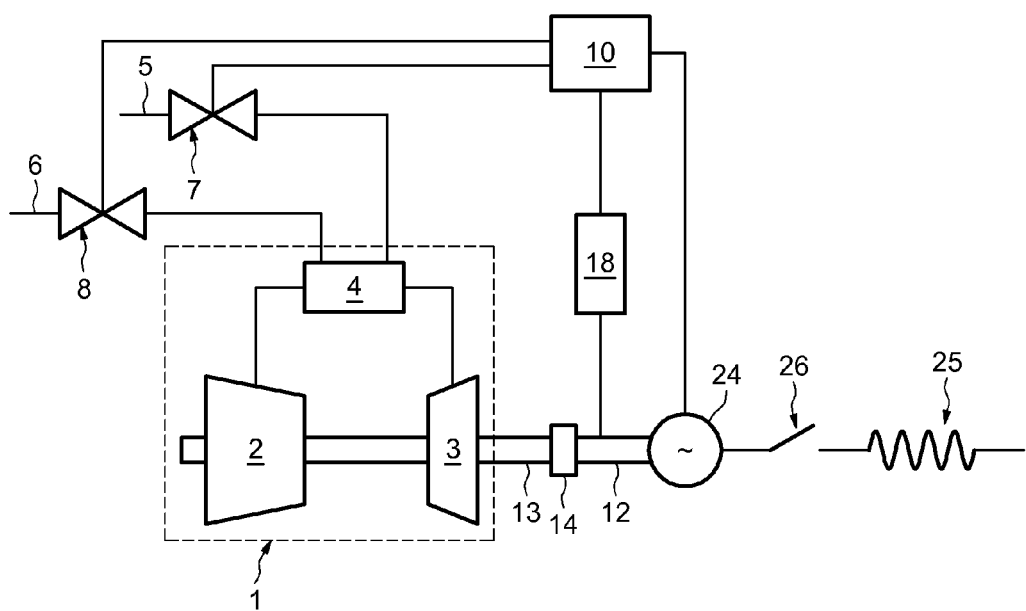
FIG. 4 is a schematic view of a third exemplary embodiment of a gas turbine test system.

FIG. 4 is a schematic view of a third exemplary embodiment of a gas turbine test system. In FIG. 4, elements identical to those of FIG. 1 bear the same numeric references. In the illustrated embodiment, the variable load 11 includes an alternator 24 coupled to a resistance 25 through a circuit breaker 26.

In the illustrated embodiment, the balance is attained when the electric power of alternator 24 is equal to the electric power consumed by resistance 25. It will be noted that the exchanges between the alternator and the resistance are here purely electrical, such that the balance of power generated and consumed is determined by measuring the current provided by the alternator.

The exemplary embodiments of a system and a method described herein provide an advantage by enabling testing of a rotary machine, particularly a gas turbine, without implementing a test of the machine on the electrical network. Thus, the embodiments described herein simplify and reduce the risks related to the implementation of a test of such a rotary machine, as well as the resources and duration required to execute such a test.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other assemblies and methods.

While the disclosure has been described in terms of various specific embodiments, those skilled in the art will recognize that the disclosure can be practiced with modification within the spirit and scope of the claims. Although specific features of various embodiments of the disclosure may be shown in some drawings and not in others, this is for convenience only. Moreover, references to "one embodiment" in the above description are not intended to be interpreted as excluding the existence of additional embodiments that also incorporate the recited features. In accordance with the principles of the disclosure, any feature of a drawing may be referenced and/or claimed in combination with any feature of any other drawing.

What is claimed is:

1. A system for testing a rotary machine, said system comprising:
    a variable load coupled to a shaft driven by the rotary machine; and
    a controller configured to regulate the rotary machine and said variable load in a closed loop such that a variation in a load value of said variable load causes a variation in a power produced by the rotary machine, said controller is further configured to determine a response time required to balance the power produced by the rotary machine and a power consumed by said variable load based on when a derivative of a rotational speed of said shaft is null.

2. The system of claim 1, wherein said controller is further configured to control the variation of the load value of said variable load.

3. The system of claim 1, further comprising a sensor operably coupled to the rotary machine, said sensor is configured to measure the rotation speed of said shaft, said controller is further configured to determine whether the power produced by the rotary machine and the power consumed by said variable load are balanced based on the measured rotation speed.

4. The system of claim 1, wherein said variable load comprises an alternator coupled to a motor through a circuit breaker, said motor is configured to drive a mechanical load.

5. The system of claim 1, wherein the rotary machine comprises a gas turbine, said controller is further configured to control a regulation valve of a fuel supply line of a combustion system of the gas turbine.

6. The system of claim 1, wherein the rotary machine comprises a gas turbine, said controller is further configured to control a regulation valve of a water supply line of a combustion system of the gas turbine.

7. The system of claim 1, wherein said variable load comprises an alternator coupled to a resistive load through a circuit breaker.

8. The system of claim 7, wherein said controller is further configured to determine whether the power produced by the rotary machine and the power consumed by said variable load are balanced based on a measured current provided by said alternator.

9. The system of claim 1, wherein said variable load comprises a compressor that includes at least one adjustment valve configured to regulate an air flow through an inlet of said variable load compressor.

10. The system of claim 9, wherein said controller is further configured to adjust the at least one adjustment valve to control the variation of the load value of said variable load.

11. The system of claim 9, wherein said controller comprises a compressor load map that stores settings of the at least one adjustment valve and corresponding load values of said variable load.

12. The system of claim 11, wherein said compressor load map further stores corresponding values of the shaft rotation speed.

13. A method for testing a rotary machine, said method comprising:
coupling a variable load to a shaft driven by the rotary machine;
regulating the rotary machine and the variable load in a closed loop such that a variation in a load value of the variable load causes a variation in a power produced by the rotary machine; and
determining a response time required to balance the power produced by the rotary machine and a power consumed by the variable load based on when a derivative of a rotational speed of said shaft is null.

14. The method of claim 13, further comprising controlling the variation of the load value of the variable load.

15. The method of claim 13, further comprising:
measuring the rotation speed of the shaft using a sensor; and
determining whether the power produced by the rotary machine and the power consumed by the variable load are balanced based on the measured rotation speed.

16. The method of claim 13, further comprising storing a set of load variation values associated with the measured response time of the rotary machine.

17. The method of claim 13, wherein said coupling the variable load to the shaft comprises coupling an alternator to a resistive load through a circuit breaker.

18. The method of claim 13, wherein said coupling the variable load to the shaft comprises coupling an alternator to a motor through a circuit breaker, wherein the motor is configured to drive a mechanical load.

19. The method of claim 13, wherein the variable load comprises a compressor, said method further comprises adjusting at least one adjustment valve of an inlet of the variable load compressor to control the variation of the load value of the variable load.

20. The method of claim 19, further comprising storing a compressor load map that comprises settings of the at least one adjustment valve and corresponding load values of the variable load.

* * * * *